United States Patent [19]

Delflache

[11] Patent Number: 4,675,574

[45] Date of Patent: Jun. 23, 1987

[54] MONITORING DEVICE FOR AIRFIELD LIGHTING SYSTEM

[75] Inventor: Robert J. Delflache, Braine-le-Comte, Belgium

[73] Assignee: n.v. ADB s.a., Brussels, Belgium

[21] Appl. No.: 798,975

[22] Filed: Nov. 18, 1985

[30] Foreign Application Priority Data

Jun. 20, 1985 [BE] Belgium .............................. 0/215229

[51] Int. Cl.$^4$ ............................................. H01J 1/60
[52] U.S. Cl. .................................... 315/130; 340/642
[58] Field of Search ................ 340/641, 642; 315/130; 307/131, 116; 361/79

[56] References Cited

U.S. PATENT DOCUMENTS

| | | | |
|---|---|---|---|
| 2,992,365 | 7/1961 | Brill | 361/79 X |
| 3,054,991 | 9/1962 | Howell | 340/642 X |
| 3,061,828 | 10/1962 | Hauck | 340/642 X |
| 3,781,853 | 12/1973 | Jacobs | 340/985 |
| 4,255,669 | 3/1981 | Naugle | 307/131 |
| 4,295,079 | 10/1981 | Otsuka et al. | 315/130 |
| 4,396,868 | 8/1983 | Watanabe et al. | 315/130 |

Primary Examiner—James L. Rowland
Assistant Examiner—Daniel Myer
Attorney, Agent, or Firm—Kramer and Brufsky

[57] ABSTRACT

A monitoring device for use with a loop circuit including a plurality of lights, which includes a monitoring current transformer having a magnetic core with a primary circuit connected in series with the loop and a secondary circuit coupled to the primary circuit, the primary circuit being arranged such that the loop current saturates the transformer core and the secondary circuit being in open-circuit condition, the monitoring current transformer generating a monitoring voltage signal in response to each inversion of the loop current. The monitoring voltage signal is used to generate a window signal during the time interval when the monitoring voltage signal has a significant value and the window signal is then used to control the integration of a signal representative of the loop voltage with a view to producing a detecting signal which is indicative of the number of defective lights. The integration time interval is thereby determined whatever the loop current waveform may be.

6 Claims, 5 Drawing Figures

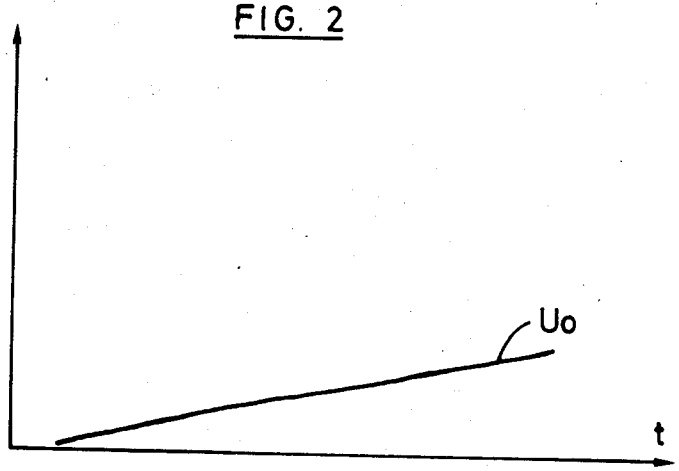
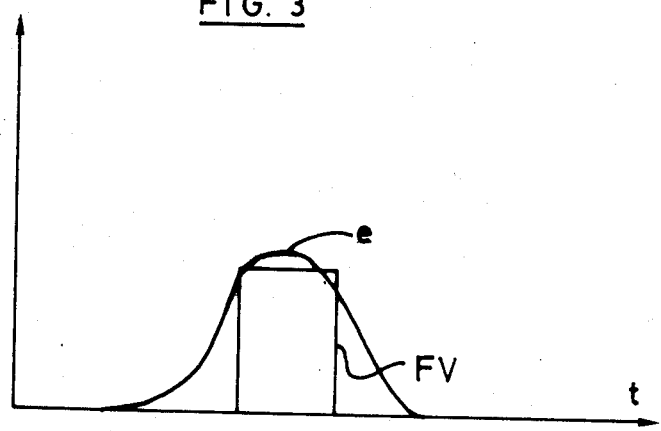

MONITORING DEVICE FOR AIRFIELD LIGHTING SYSTEM

BACKGROUND OF THE INVENTION

The present invention relates to the monitoring of airfield lighting systems and more particularly to a monitoring device for continuously detecting the amount of defective lights in an airfield lighting system.

Airfield lighting systems use lights installed inter alia along runways, taxiways and threshold edges of an airfield to serve as visual navigation aids for the pilots on aircrafts. These lights are commonly coupled to a plurality of isolating transformers which have their primary circuits serially interconnected in a loop circuit supplied by a constant current AC power source, each light being connected to the secondary circuit of a respective isolating transformer. In such plants, the amount of defective lights is never allowed to exceed a few units as required by the security standards for aviation. In order to meet these requirements it is necessary to provide for a continuous monitoring of the airfield lights with a view to detect immediately the amount of lights which become defective.

When a light become defective, the secondary circuit of the isolating transformer to which it is connected is set in open-circuit condition so that a short voltage peak is then produced across the said isolating transformer during the time when the instantaneous induction therein is reversed. The voltage peak is superimposed on the sum of the voltages across all the isolating transformers of which the secondary circuits are still in closed-circuit condition, that is the transformers which are coupled to lights that are still in operating condition.

It can be shown that the integral of such a voltage peak depends very little on the waveform and on the amplitude of the loop current so long as said current is much higher than the saturation current in the isolating transformers, which is practically always the case in airfield plants. When several lights are defective, several voltage peaks are thus superimposed on one another and the integral of these voltage peaks is representative of the number of isolating transformers which have their secondary circuits in open-circuit condition, that is an image of the number of defective lights. It is therefore possible to determine the amount of defective lights by measuring the integral of said superimposed voltage peaks.

A device for generating an output voltage indicative of the number of isolating transformers in open-circuit condition is described in U.S. Pat. No. 4,323,841 issued to Lelf V. Jacobsen. In this prior art device, the output voltage is the voltage integral of the loop voltage from the time when the loop current in each half period passes the zero value and the time when the loop current attains a value corresponding to the saturation current for the isolating transformers. This device has the disadvantage that the edges of the integration window cannot be determined accurately in advance due to the constructional and operational variations from one transformer type to another. In practice, a sophisticated apparatus, e.g. an oscilloscope, is required to adjust each device individually on the spot in order to settle the beginning and end edges of the integration window when the current passes the zero value and attains the saturation value respectively. Moreover, these edges cannot be readily recognized, especially when the loop is supplied by a resonant type current regulator.

This inaccuracy in determining the width of the integration window is detrimental to the detection accuracy. Indeed, in order to obtain a high detection accuracy it is most desirable to determine the voltage integral over a time window during which the superimposed voltage peaks have a significant value. Further, the said inaccuracy in determining the width of the integration window is all the more detrimental to the detection accuracy as there is a requirement for detecting a low percentage of defective lamps and especially when the loop is supplied by a resonant current regulator which provides a quasi-sinusoidal output current.

SUMMARY OF THE INVENTION

It is an object of this invention to provide an improved monitoring device and method of detecting the amount of defective lights in an airfield lighting system, which successfully avoid the above-mentioned disadvantage of the prior art. In particular, the device and method according to this invention provide a high detection accuracy without necessitating an adjustment of the beginning and end edges of the integration window on the spot, even when a low percentage of defective lights should be detected and when the lights are interconnected in series in a loop circuit connected to a resonant current regulator.

Briefly, in accordance with one aspect of this invention, a monitoring device is provided which comprises a monitoring current transformer having a magnetic core with a primary circuit connected in series with the loop and a secondary circuit coupled to the primary circuit, said primary circuit being arranged such that the loop current saturates the transformer core and said secondary circuit being in open-circuit condition, said monitoring current transformer generating a monitoring voltage signal in response to each inversion of the loop current; enabling circuit means coupled to accept said monitoring voltage signal and arranged for generating an output window signal during the time interval when the monitoring voltage signal has a significant value; integrating means coupled to be responsive to an image voltage signal representative of the loop voltage and to said window signal, thereby to generate an output signal integral proportional to the integration of said image voltage signal during the occurrence of the window signal; and subtracting means connected to produce a detecting signal proportional to the difference between said output voltage integral and a signal representative of the loop voltage when all the lights are in operating condition, whereby said detecting signal is indicative of the number of defective lights.

In accordance with a second aspect of the invention, a method of detecting defective lights is provided which comprises generating a monitoring voltage signal in response to the variation of induction produced in a current transformer having a primary circuit supplied by the loop current so as to saturate the core thereof and a secondary circuit in open-circuit condition, generating a window signal during a time interval when said monitoring voltage signal has a significant value; generating an output voltage signal representative of the loop voltage integral during the occurrence of said window signal; and generating a detecting signal in response to said output voltage signal and to a signal representative of the loop voltage when all the lights are in operating condition, said detecting signal being proportional to the difference between the input signals thereto, whereby said detecting signal is indicative of the number of defective lights.

BRIEF DESCRIPTION OF THE DRAWINGS

A more complete appreciation of the invention will be readily obtained as the same become better understood by reference to the following description of an exemplary embodiment of a monitoring device according to this invention when considered in connection with the accompanying drawings, wherein:

FIGS. 2 to 5 are waveforms showing the operation of an exemplary monitoring device in accordance with this invention.

DETAILED DESCRIPTION OF AN EXEMPLARY EMBODIMENT

Figure 1:
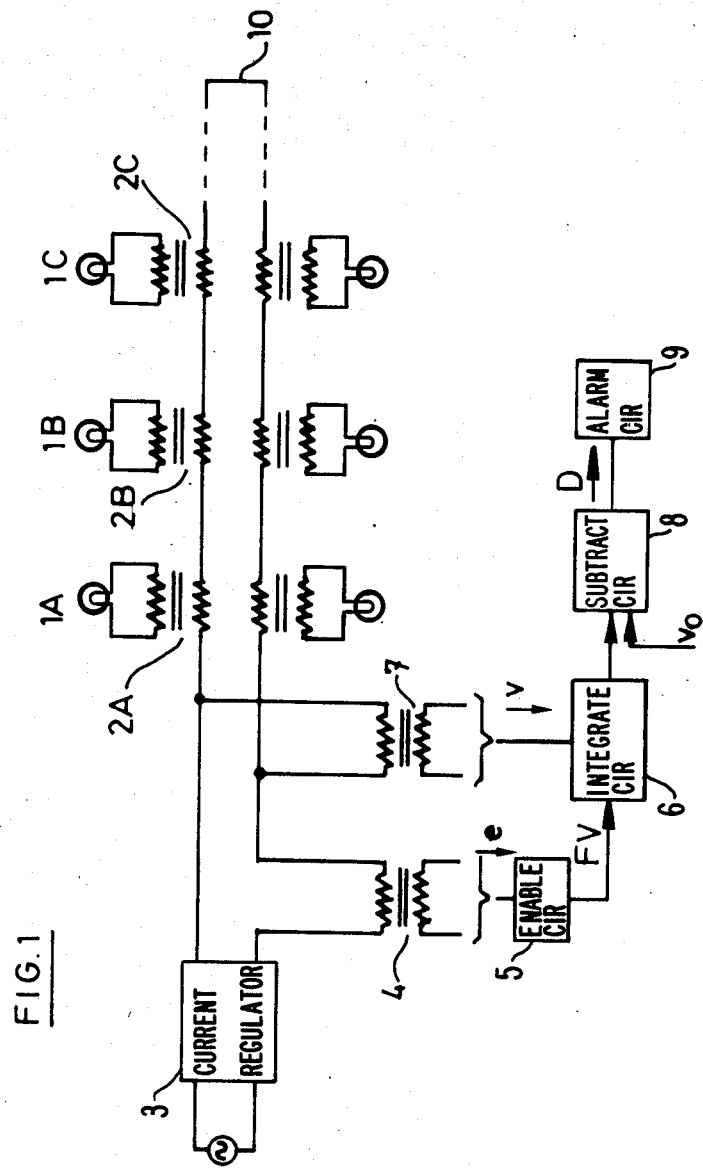
FIG. 1 is a schematic circuit diagram of a typical airfield lighting system which includes a monitoring device according to this invention.

Referring to FIG. 1, a circuit diagram is shown as including a plurality of lights 1A, 1B, 1C ... coupled to a loop circuit 10 through isolating transformers 2A, 2B, 2C ... which have their primary circuits connected in series with a constant current regulator 3 supplying an alternating current. Each light 1 is connected across the secondary circuit coupled to the primary circuit of a respective one of said isolating transformers 2. The loop circuit may comprise any number of isolating transformers.

In accordance with this invention, a monitoring current transformer 4 is provided having a magnetic core with a primary circuit connected in series with the loop 10 and a secondary circuit in open-circuit condition. The primary circuit is arranged such that the loop current flowing therethrough saturates the magnetic core. In operation, the loop current flows through the primary circuit of the monitoring transformer 4 and at each inversion of the loop current, a voltage signal e of short duration is induced across the secondary circuit of said transformer. This voltage signal e will be called monitoring signal and is illustrated in the time diagram of FIG. 3. In this and the other accompanying diagrams, the time is plotted in abscissa with an enlarged scale. FIG. 2 shows a portion of an exemplary waveform Uo of the voltage across the loop 10 when all the lights 1 are in operating condition.

The output signal from the integrating circuit 6 is applied to an input of a subtracting circuit 8 which has a second input that accepts a signal Vo representative of the loop voltage when all the lights 1 are in operating condition. The subtracting circuit 8 is arranged to produce a detecting signal D proportional to the difference between the voltage integral signal from the integrating means 6 and the signal Vo, said detecting signal D providing a representation of the disturbance in the loop voltage waveform corresponding to the defective light(s), that is the detecting signal is indicative of the number of defective lights.

Figure 4:
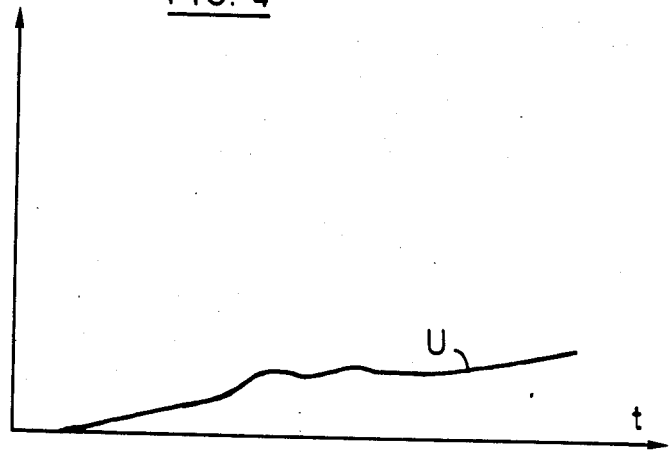
Figure 5:
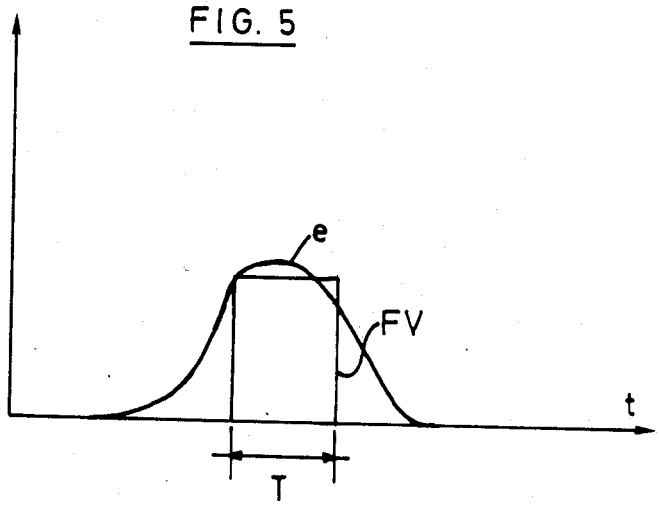

When a light 1 becomes defective, a voltage peak is produced across the corresponding isolating transformer 2 and this voltage peak is superimposed on the loop voltage. The waveform shown in FIG. 4 illustrates a portion of a typical loop voltage waveform U produced when a small number of isolating transformers 2 have their secondary circuits in open-circuit condition, i.e. when a small number of lights 1 are defective: one can readily notice the disturbance superimposed on the regular voltage waveform as shown in FIG. 2. This disturbance produced in the loop voltage waveform U is representative of the number of defective lights. FIG. 5 shows the waveform of the corresponding monitoring signal e across the monitoring current transformer 4.

In order to detect the disturbance in the voltage waveform in accordance with this invention, use is made of the significant portion of the monitoring voltage signal e. Referring back to FIG. 1, said monitoring signal e is applied to an enabling circuit 5 arranged to produce an output window signal during the time interval when said monitoring signal e has a significant value and said window signal FV is used as a control signal for an integrating circuit 6 which has an input coupled to accept a voltage signal V representative of the loop voltage U. In FIG. 1, the voltage V is produced by a voltage transformer 7 having its primary circuit connected across the loop circuit 10. The integrating circuit 6 is arranged to produce an output signal integral proportional to the integration of the image voltage signal V during the occurrence of the window signal FV, whereby the edges of the ingegration interval are accurately defined in the device itself.

In an exemplary embodiment, the enabling circuit 5 is advantageously arranged to produce the said window signal FV when the monitoring voltage is comprised between a first fraction of the area under the monitoring signal curve e (e.g. 20%) and a second fraction (e.g. 80 %) of said area. In an another embodiment, the enabling circuit could be arranged to produce the window signal when the amplitude of the monitoring voltage signal e is comprised between a first predetermined threshold value and a second predetermined threshold value.

FIG. 5 illustrates a window signal FV produced when the monitoring voltage signal e is comprised between 20% and 80% of the area under the curve e, whereby the disturbance in voltage waveform U (FIG. 4) is taken into consideration during the time interval T, i.e. the duration of the window signal FV. It is emphasized that the integration time T is determined in the device of the invention with reference to the monitoring voltage signal e and this is achieved with great accuracy whatever the current waveform may be and irrespective of the number of defective lights, thereby avoiding the disadvantages of the prior art as set forth in the introduction to the description.

The output signal from the integrating circuit 6 is applied to an input of a subtracting circuit 8 which has a second input that accepts a signal Vo representative of the loop voltage Uo when all the lights 1 are in operating condition. The subtracting circuit 8 is arranged to produce a detecting signal D proportional to the difference between the voltage integral signal from the integrating means 6 and the signal Vo, said detecting signal D providing a representation of the disturbance in the loop voltage waveform corresponding to the defective light(s), that is the detecting signal is indicative of the number of defective lights.

The detecting signal D may be applied to an indication and/or alarm device (9) thereby to produce a signal indicating the number of defective lights and/or one or a plurality of alarm signals when the number of defective lights reaches a predetermined value. It is to be understood that the alarm device could also be arranged to produce at least one prealarm signal when the number of defective lights reaches a predetermined prealarm value lower than the said alarm value.

What is claimed is:

1. An electrical circuit for monitoring the operation of a plurality of lights, comprising:

power source means for supplying constant current AC power;

a plurality of isolation transformer means, each of said transformers plurality having serially interconnected primary circuitry, said interconnected primary circuitry coupled to said power source means forming a circuit loop, each of said transformer plurality having secondary circuitry electrically coupled to a corresponding one of the plurality of lights;

monitoring current transformer means having a magnetic core with a primary circuit serially coupled to said circuit loop such that said core magnetically saturates in response to current flowing through said circuit loop, said monitoring current transformer means having a secondary circuit in a substantially open circuit condition for generating a monitoring signal in response to each inversion of current in said circuit loop;

enabling circuit means coupled to receive said monitoring signal for providing an output window signal having a duration corresponding to the time said monitoring signal amplitude is within a predetermined range;

means coupled to said circuit loop for providing signals indicative of the voltage across said serially interconnected isolation transformer means primary circuitry;

integrating circuit means receiving said voltage indicating signals and said output window signals, for providing an integrated voltage signal during the presence of said output window signal; and subtracting circuit means coupled to receive said integrated voltage signal and a reference voltage signal indicative of current loop voltage when all of the plurality of lights are operative, for providing a difference signal indicative the number of defective lights in the loop.

2. A circuit according to claim 1 wherein said enabling circuit means integrates said monitoring signal, initiating said output window signal when an integral of said monitoring signal has a first value and terminating said output window signal when said integral has a second value.

3. A circuit according to claim 1 wherein said enabling circuit means provides said output window signal only when said monitoring signal voltage amplitude is substantially between first and second threshold values.

4. A circuit according to claim 1 further comprising alarm means coupled to receive said difference signal, for providing signals indicative of when the number of defective lights reaches a predetermined value.

5. A circuit according to claim 4 further comprising prealarm means responsive to said difference signal for providing at least one prealarm signal when the number of defective lights reaches a selected value that is lower than said predetermined alarm value.

6. A method for monitoring the operation of a plurality of electrical lights, comprising the steps of:

providing a constant current AC power source;

serially connecting the primary windings of a plurality of isolation transformers to said AC power source to form a circuit loop;

coupling the secondary windings of each of said isolation transformers to a corresponding lamp;

providing a monitoring current transformer having a magnetic core with a primary circuit serially coupled to said circuit loop and a secondary circuit in substantially open circuit condition, such that said core magnetically saturates in response to current flowing through said circuit loop to generate a monitoring signal in response to each inversion of current in said circuit loop;

coupling said monitoring signal to an enabling circuit for producing an output window signal during a time period when said monitoring signal amplitude is within a predetermined range;

determining the voltage across the serially connected primaries of said isolation transformers;

integrating said determined voltage during the occurrence of said output window signal; and subtracting said integrated voltage signal from a reference signal indicative of the voltage across the serially connected primaries of said isolation transformers when all of the plurality of lights are operative, thereby providing a difference signal indicative of the number of defective lamps in the loop.

* * * * *